US009270284B1

(12) United States Patent
Mnich et al.

(10) Patent No.: US 9,270,284 B1
(45) Date of Patent: Feb. 23, 2016

(54) METHOD FOR CREATING A RELIABLE PHASE-LOCKED LOOP IN A RUGGEDIZED OR HARSH ENVIRONMENT

(71) Applicant: Aeroflex Colorado Springs Inc., Colorado Springs, CO (US)

(72) Inventors: Christopher Mnich, Colorado Springs, CO (US); Jonathan Mabra, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 0 days.

(21) Appl. No.: 14/524,988

(22) Filed: Oct. 27, 2014

(51) Int. Cl.
*H03L 7/06* (2006.01)
*H03L 7/08* (2006.01)

(52) U.S. Cl.
CPC ........................................ *H03L 7/08* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 6,349,391 B1* | 2/2002 | Petivan | ................. | G06F 11/165 712/10 |
| 7,995,698 B2* | 8/2011 | Liu | ....................... | H03L 7/0814 327/147 |
| 8,040,988 B2* | 10/2011 | Chang | ...................... | H03L 7/07 327/141 |
| 8,687,738 B1* | 4/2014 | Lee | ........................ | H04L 7/033 327/141 |
| 2010/0271090 A1* | 10/2010 | Rasmussen | ........ | H03H 17/0219 327/158 |
| 2013/0021073 A1* | 1/2013 | Kim | ........................ | H03L 7/085 327/158 |

* cited by examiner

*Primary Examiner* — Adam Houston
(74) *Attorney, Agent, or Firm* — Peter J. Meza; Hogan Lovells US LLP

(57) ABSTRACT

A phase-locked loop (PLL) circuit system includes first, second, and third PLL circuits, first, second, and third multiplexer circuits coupled to the first, second, and third PLL circuits, and a majority voter circuit coupled to the first, second, and third PLL circuits, wherein the PLL circuit system provides a glitch-free output clock signal by selecting a locked PLL circuit. Each PLL circuit includes a first input for receiving a reference clock signal; a second input for receiving a feedback clock signal; a first output for providing an output clock signal; a second output for providing a lock signal; and a return path coupled between the first output and the second input. The return path can be a direct connection or a logic circuit. Each multiplexer circuit includes three lock inputs, a first clock input, a second clock input, a defeat input, and a clock output.

17 Claims, 8 Drawing Sheets

| LOCK<2> | LOCK<1> | LOCK<0> | MAJ_LOCK | MUX_CLK |
|---|---|---|---|---|
| 0 | 0 | 0 | 0 | DEFEAT |
| 0 | 0 | 1 | 0 | CLK |
| 0 | 1 | 0 | 0 | DEFEAT |
| 0 | 1 | 1 | 1 | CLK |
| 1 | 0 | 0 | 0 | DEFEAT |
| 1 | 0 | 1 | 1 | CLK |
| 1 | 1 | 0 | 1 | CLK_SUB |
| 1 | 1 | 1 | 1 | CLK |

*Fig. 3*

| LOCK | MAJ_LOCK | MUX_CLK |
|---|---|---|
| 0 | 0 | DEFEAT |
| 0 | 1 | CLK_SUB |
| 1 | 0 | CLK |
| 1 | 1 | CLK |

METHOD FOR CREATING A RELIABLE PHASE-LOCKED LOOP IN A RUGGEDIZED OR HARSH ENVIRONMENT

FIELD OF THE INVENTION

The present invention relates to phase-locked loop (PLL) circuits, and, more particularly, to a radiation-hardened PLL circuit system for providing a reliable output clock signal despite a harsh operating environment.

BACKGROUND OF THE INVENTION

PLL circuits are well known in the art. The operation of providing a synchronized output clock signal with respect to an input reference clock is also well known. Prior art PLL circuits or circuit systems may have extended periods of time where no output clock is produced while the PLL circuit or circuits are re-locking. This can occur, for example, in a harsh operating environment such as a space environment wherein a single charged particle can temporarily or even permanently affect the performance of a single PLL. What is desired is a PLL circuit system that can reliably provide the desired synced output clock signal even though a single PLL in the circuit system may be temporarily or permanently made unavailable.

SUMMARY OF THE INVENTION

The present invention uses a novel method of multiplexing between a number of phase-locked loop circuits through the use of the lock signals from each PLL such that an output clock is produced for every input clock so long as any PLL is currently locked. The circuit and method of the present invention always selects a PLL that is locked.

A phase-locked loop (PLL) circuit is needed for an integrated circuit application wherein the output frequency and phase of the PLL circuit match those of the input reference clock. Additionally, the resultant output clock from the PLL must be produced on a one-to-one basis relative to the input reference clock once the PLL achieves lock; that is, once the PLL is locked, an output clock must be synthesized for every incoming reference clock. The application demands that the PLL never fails to produce an output clock in response to the reference clock. That is to say, the PLL must never lose lock, provided a clean and stable input reference clock source.

According to the present invention, a system of phase-locked loop circuits generate a singular output whereby the selected output is determined by the state of the lock signals for each PLL. A seamless transition between all operational cases is provided for producing a glitch-free output clock.

According to the present invention, the circuit and method can be used with any circuit technology. The circuit and method of the present invention is used to create robust phase-locked loop clock sources that are used in harsh environments where upsets are likely.

According to the present invention, a phase-locked loop (PLL) circuit system comprises first, second, and third PLL circuits; first, second, and third multiplexer circuits coupled to the first, second, and third PLL circuits, and a majority voter circuit coupled to the first, second, and third PLL circuits, wherein the PLL circuit system provides a glitch-free output clock signal by selecting a locked PLL circuit. Each PLL circuit comprises a first input for receiving a reference clock signal; a second input for receiving a feedback clock signal; a first output for providing an output clock signal; a second output for providing a lock signal; and a return path coupled between the first output and the second input. The return path can comprise a direct connection or a logic circuit. Each multiplexer circuit comprises three lock inputs, a first clock input, a second clock input, a defeat input, and a clock output. Each multiplexer circuit comprises a majority voter circuit coupled to the three lock inputs, a multiplexer coupled to the second clock input and the defeat input, a logic circuit coupled to the first clock input, and a logic circuit coupled to the clock output. The majority voter circuit provides the glitch-free output clock signal.

BRIEF DESCRIPTION OF THE DRAWINGS

FIG. 3 is a PLL clock multiplexer logic truth table according to the present invention;

FIG. 7 is a PLL clock multiplexer logic truth table associated with FIG. 5; and

DETAILED DESCRIPTION

The method and circuit of the present invention described below results in a PLL that will properly generate an output clock that is frequency-matched and phase-aligned to the input reference clock in an environment that could cause a singular PLL to become unlocked and thus skip, misalign, or distort an output clock. The design of the PLL itself is relatively inconsequential to the application of this invention and thus only the key modifications and additions required to implement the invention are described below.

According to the present invention, a system of independent PLL circuits is used to generate output clocks that are individually frequency-matched (equal to, divisible by, or a multiple of the input frequency) and phase-aligned to an input reference clock and use these outputs to derive a final, singular output clock based on the conditional voting of each of the outputs. The implementation of this conditionality on the voting is an important aspect of the invention, as will be described below. In one embodiment of the present invention, the system is described as using three PLL circuits. The methods described below could be adapted by one skilled in the art to cover any number of PLL circuits greater than two.

Figure 1:
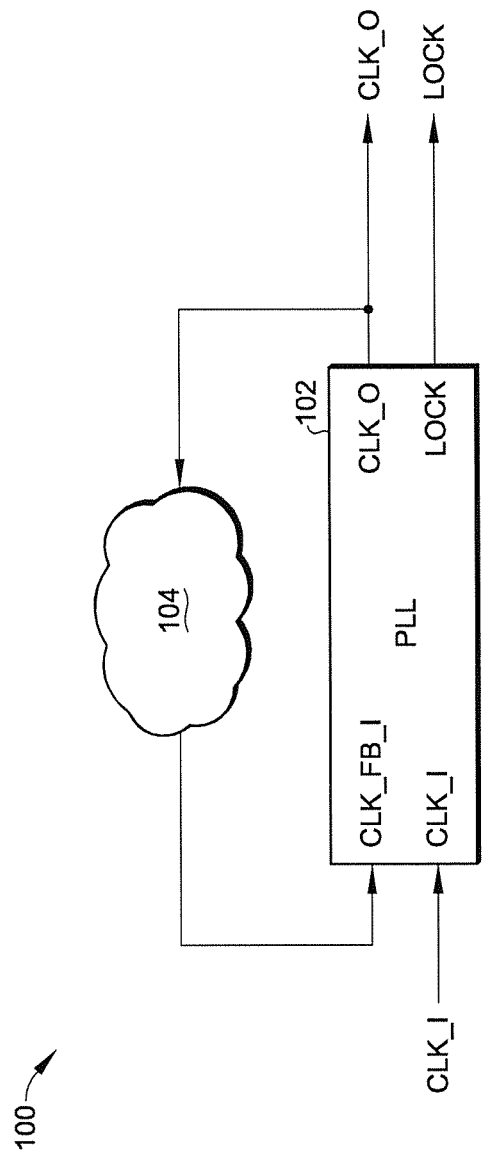
FIG. 1 is a circuit diagram of a single instantiation of a PLL circuit.

A single instantiation of the core PLL circuit 100 is shown in FIG. 1. This PLL 102 has an input reference clock (CLK_I), a feedback clock input (CLK_FB_I), an output clock (CLK_O), and an output that indicates whether the PLL is locked or not (LOCK; low= not locked, high=locked). In order to complete the loop, CLK_O is returned to CLK_FB_I. This return path (represented by the cloud 104 in FIG. 1) can contain logic or be a direct connection; typically, this path consists of a replica path that is being measured so as to advance the phase of CLK_O relative to CLK_I, such that at the endpoint of the actual path of CLK_O is timed to match the input CLK_I (removing the clock-inserted delay). The internal workings of this PLL are, again, not anything new.

The LOCK detection mechanism is a unique feature. LOCK is generated (goes high) sometime after CLK_O is frequency-matched to CLK_I.

An implementation and method for a redundant PLL would be to simply take the CLK_O outputs and use a majority voter circuit to generate a final output; however, this approach would have some undesired effects. While the individual PLLs were trying to lock, their output clocks might not all match up and thus the final output could include unwanted glitches. Additionally, if one or more of the PLLs fell out of lock for any reason, then the final output clock could again include glitches, have missing edges, or not even toggle at all. To prevent this type of behavior there are a few required enhancements.

Figure 2:
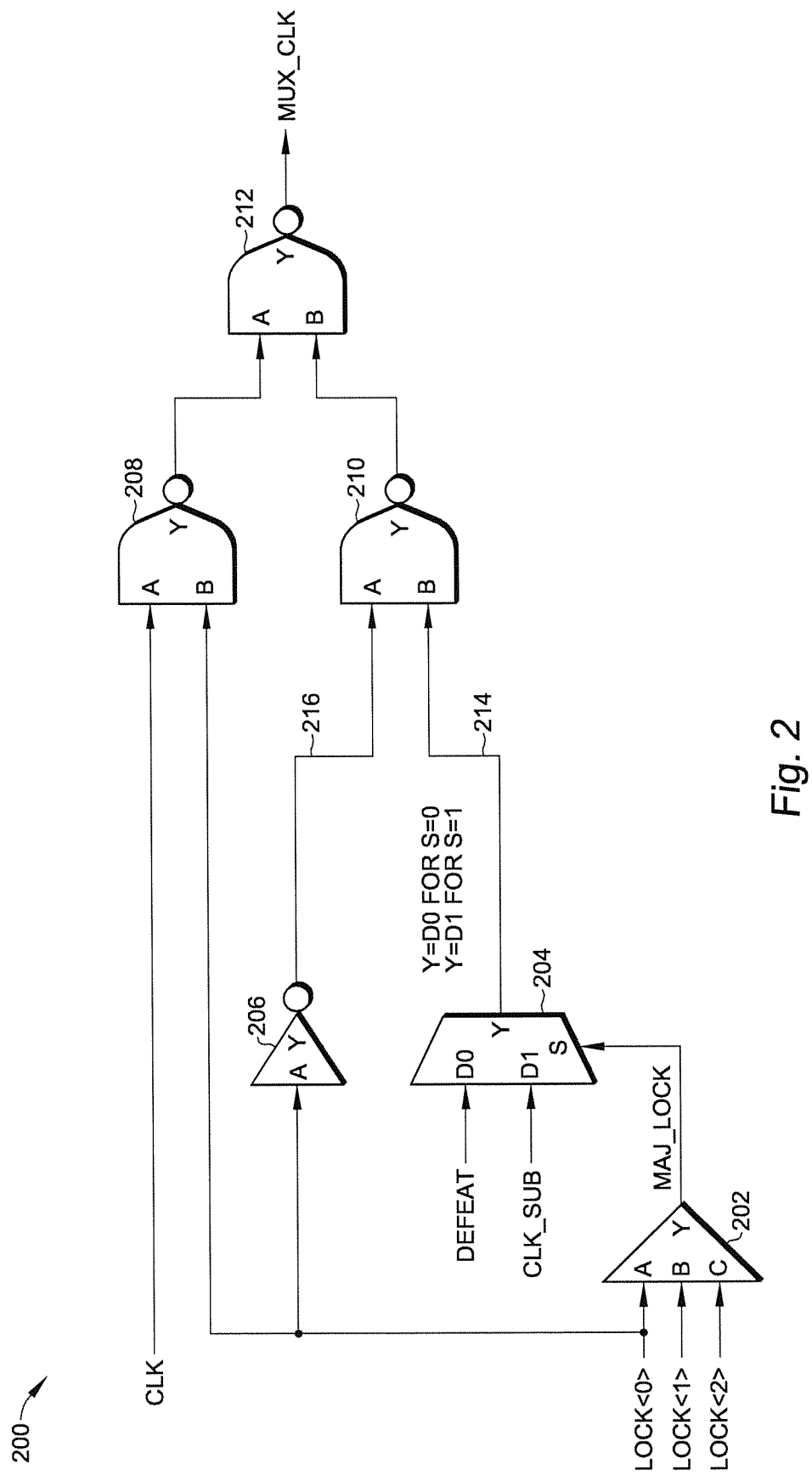
FIG. 2 is a circuit diagram of a PLL clock multiplexer logic circuit according to the present invention.
Figure 4:
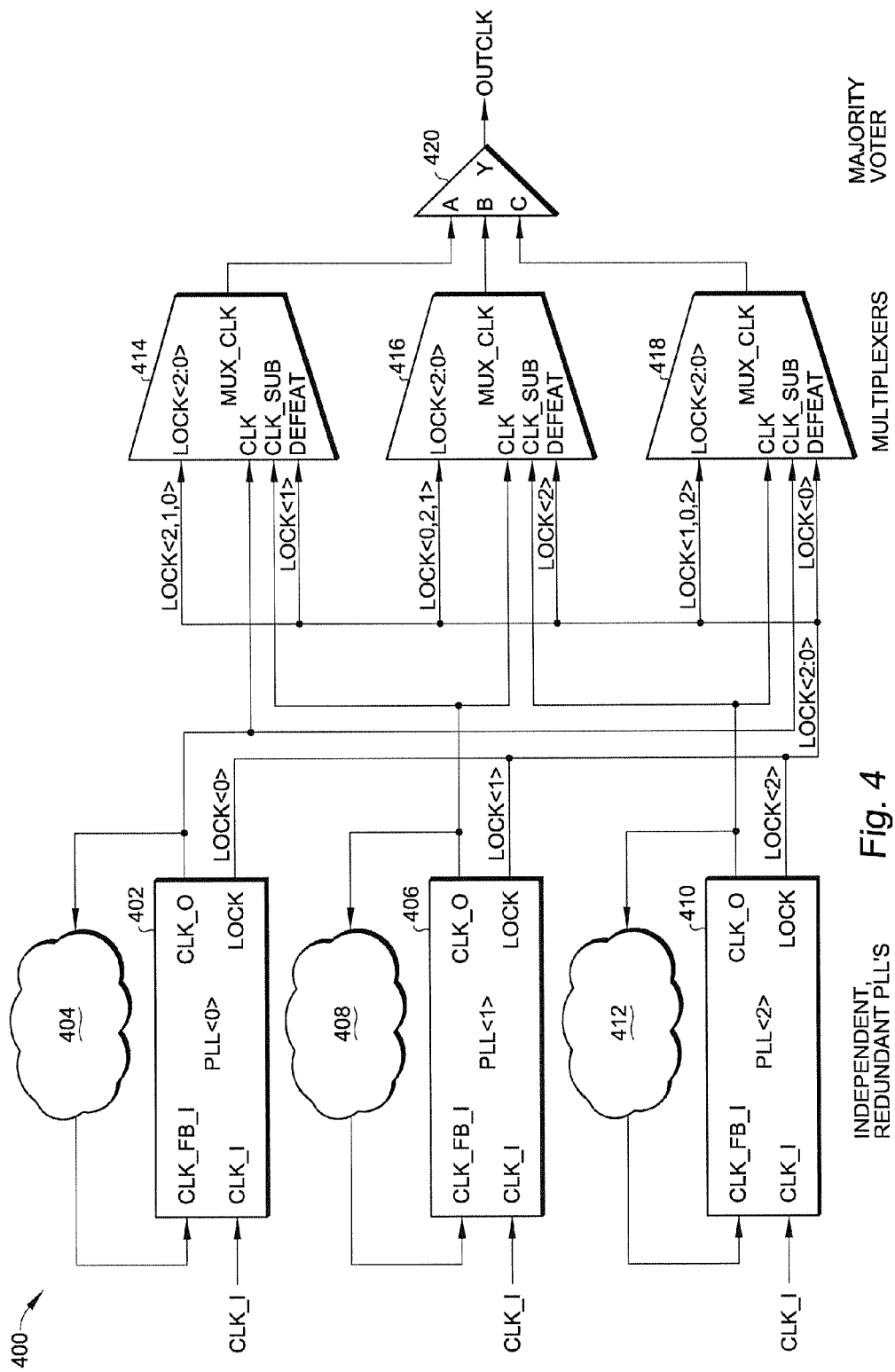
FIG. 4 is a circuit diagram of a PLL multiplexer implementation according to the present invention.

The first enhancement according to the present invention is to have a system of multiplexing circuits that will use the states of the LOCK signals to determine what to do with the output clock (CLK_O) for each instance of the PLL. These multiplexers each accept six inputs (CLK, CLK_SUB, DEFEAT, and LOCK from each individual PLL [3 total, in an embodiment of the present invention]) and each generates a single output (MUX_CLK). The logic inside the multiplexer 200 can be seen in FIG. 2. Note that multiplexer re-appears three times in FIG. 4 as multiplexers 414, 416, and 418 in the final implementation of the invention. The circuit shown in FIG. 4 is described in further detail below.

Turning again to FIG. 2, the PLL clock multiplexer logic circuit 200 includes a majority voter circuit 202 for receiving three lock signals: LOCK <0>, LOCK <1>, and LOCK <2>. Again, the significance of these signals and other signals is described below in further detail with respect to both FIGS. 2 and 4. The output of majority voter circuit 202 provides the MAJ_LOCK output signal. Multiplexer 204 includes DEFEAT and CLK_SUB inputs and outputs a multiplexed output signal 214 under control of the MAJ_LOCK control signal. Logic circuit 200 also includes a CLK input at an input of NAND gate 208. Inverter 206 and another input of NAND gate 208 receives the LOCK <0> signal. The inputs of NAND gate 210 are coupled respectively to the output 216 of inverter 206 and the output 214 of multiplexer 204. In turn, the inputs of output NAND gate 212 are respectively coupled to the output of NAND gate 208 and NAND gate 210. The output of NAND gate 212 provides a MUX_CLK signal.

When the LOCK <0> signal is high, this circuit relays the CLK input to the MUX_CLK output; all other inputs are ignored. When the LOCK <0> is low, the lower path becomes sensitized. In this condition, if the majority of the LOCK <2:0> signals are low, then the MAJ_LOCK signal will be low and the DEFEAT signal will be passed to the MUX_CLK output; if the majority of the LOCK <2:0> signals are high, then the MAJ_LOCK signal will be high and the CLK_SUB signal will be passed to the MUX_CLK output. The truth table 300 for the multiplexer circuit 200 is given in FIG. 3.

The FIG. 3 truth table 300 shows the logic state of the LOCK <2>, LOCK <1>, LOCK <0>, MAJ_LOCK, and MUX_CLK signals. The output MUX_CLK signal assumes the logic state of the DEFEAT, CLK, or CLK_SUB input signals as shown and described above.

Again, while this description shows a three PLL system, the majority vote function in the multiplexer logic could be modified to encompass any number of PLL circuits, as is described in further detail below.

To allow the PLLs to seamlessly transition into and out of locked states while maintaining a proper output, the following programming is used on the system of multiplexers (as is shown in FIG. 4).

The PLL multiplexer implementation 400 according to the invention includes three single PLL circuits 402/404, 406/408, 410/412 as previously described with respect to PLL circuit 100 shown in FIG. 1. The PLL multiplexer implementation 400 according to the present invention also includes three multiplexer logic circuits 414, 416, and 418 as previously described with respect to the PLL clock multiplexer logic circuit 200 shown in FIG. 2. With respect to multiplexer circuit 414, the three LOCK inputs are coupled to the LOCK <2:0> bus in the LOCK <2,1,0> configuration. The CLK input is coupled to the CLK_O output of PLL 402. The CLK_SUB input is coupled to the CLK_O output of PLL 406. The DEFEAT input receives the LOCK <1> signal. With respect to multiplexer circuit 416, the three LOCK inputs are coupled to the LOCK <2:0> bus in the LOCK <0,2,1> configuration. The CLK input is coupled to the CLK_O output of PLL 406. The CLK_SUB input is coupled to the CLK_O output of PLL 410. The DEFEAT input receives the LOCK <2> signal. With respect to multiplexer circuit 418, the three LOCK inputs are coupled to the LOCK <2:0> bus in the LOCK <1,0,2> configuration. The CLK input is coupled to the CLK_O output of PLL 410. The CLK_SUB input is coupled to the CLK_O output of PLL 402. The DEFEAT input receives the LOCK <0> signal. The inputs of majority voter circuit 420 are coupled to the outputs of multiplexer circuits 414, 416, and 418. Majority voter circuit 420 provides the OUTCLK signal, which is the desired glitch-free, synced, output clock signal.

The input CLK is always tied to the CLK_O output of the given instance of the PLL. CLK_SUB is tied to the CLK_O output of the next instance of the PLL; that is, CLK_SUB for PLL <0> is the CLK_O output from PLL <1>, CLK_SUB for PLL <1> is the CLK_O output from PLL <2>, and CLK_SUB for PLL <2> is the CLK_O output from PLL <0> (this patter could continue indefinitely). The signal DEFEAT has a similar programming to the CLK_SUB except that it is tied to the LOCK signal from the next instance of the PLL; that is, DEFEAT for PLL <0> is the LOCK signal from PLL<1>, DEFEAT for PLL <1> is the LOCK signal from PLL <2>, and DEFEAT for PLL <2> is the LOCK signal from PLL <0> (this pattern could continue indefinitely as well). The output of each of the multiplexers is sent to a final majority voter circuit to generate the final voted output clock (OUTCLK). The result of this programming is not readily apparent, but a walkthrough of the logic yields a unique solution according to the present invention.

Consider the case where none of the PLLs are locked. In this condition, all of the multiplexer blocks will be set to put out their programmed DEFEAT value. Additionally, since all of the LOCK signals are low, all the MUX_CLK outputs will be low, and thus OUTCLK will be low. If PLL<0> reaches lock while the other PLLs do not, then LOCK<0> will be high and LOCK<1> and LOCK<2> will be low. In this case the multiplexer for PLL<0> will pass its CLK input to its MUX_CLK output since the LOCK<0> signal into the block is high. The other two multiplexers will be in the mode where they are passing their programmed DEFEAT values to their MUX_CLK outputs. In the case of the multiplexer for PLL<1>, the DEFEAT value (LOCK <2>) is low, so it will output a DC low value; in the case of the multiplexer for PLL<2>, the DEFEAT value (LOCK<0>) is high, so it will output a DC high value. Thus, at the final majority voter the A input is equal to the CLK_O output from PLL<0>, the B input is a DC low, and the C input is a DC high; OUTCLK is thus a replica of the CLK_O output from PLL<0> since the B and C input states allow the A input to be sensitized. Similar behavior exists for when only PLL<1> reaches lock. This time at the final majority voter, the A input is a DC high since the multiplexer for PLL<0> is passing its programmed DEFEAT value (LOCK<1>) to its MUX_CLK output, the B input is the CLK_O output from PLL<1>, and the C input is a DC low since the multiplexer for PLL<2> is passing its programmed DEFEAT value (LOCK<0>) to its MUX_CLK output; OUTCLK is thus a replica of the CLK_O output from PLL<1>. The same behavior exists again for when only PLL<2> reaches lock. This time at the final majority voter, the A input is a DC low since the multiplexer for PLL<0> is passing its programmed DEFEAT value (LOCK<1>) to its MUX_CLK output, the B input is a DC high since the multiplexer for PLL<1> is passing its programmed DEFEAT value (LOCK<2>) to its MUX_CLK output, and the C input is the CLK_O output from PLL<2>; OUTCLK is thus a replica of the CLK_O output from PLL<2>. The previous description has dealt with the cases where no PLL is locked and where each PLL is the only one that is locked, now the cases where multiple PLLs are locked simultaneously is explored.

In the case where PLL<0> and PLL<1> are both locked (PLL<2> is not locked) each of their multiplexers will be passing their respective CLK inputs to their respective MUX_CLK outputs. The multiplexer for PLL<2> will have its CLK_ SUB input passed to its MUX_CLK output because the majority of LOCK signals (LOCK<0> and LOCK<1>) are high, thus the MAJ_LOCK signals are high, but PLL<2> itself is not locked (LOCK<2> is low). Since MAJ_LOCK is high inside the multiplexers, the CLK_SUB path is sensitized instead of the DEFEAT path. In the case of the multiplexer for PLL<2> the CLK_SUB input is programmed to be the CLK_O output from PLL<0>. At the final majority voter, inputs A and B will be replicas of the CLK_O output from PLL<0> and the CLK_O output from PLL<1>, respectively, and the C input will also be a replica of the CLK_O output from PLL<0>. Therefore, the final voted output will only be determined by the CLK_O output from PLL<0>. The PLL<1> path is still running as a backup, but it is effectively ignored at the final voter. If for any reason PLL<0> were to suddenly lose lock, then the MAJ_LOCK signal would go low and the system would return to the state where only PLL<1> is controlling the final output. This same behavior exists for all combinations of having only two of the PLLs in the locked state. Though two paths are locked, only one of them will actually determine the final voted output while the other path serves as a backup in case the PLL driving the output suddenly loses lock. In the case where PLL<0> and PLL<2> are both locked and PLL<1> is not locked, PLL<2> will be the one that determines the output while PLL<0> serves as the backup. In the case where PLL<1> and PLL<2> are both locked and PLL<0> is not locked, PLL<1> will be the one that determines the output while PLL<2> serves as the backup.

Finally, in the case where all the PLLs are locked, each of the multiplexers will pass their CLK input (the CLK_O outputs from each respective PLL) to their CLK_MUX output. All the input ports at the final majority voter will be unique and thus a true majority vote of all three inputs will determine the behavior of OUTCLK. If one or two of the PLLs were to suddenly lose lock, the previously described behavior where only one PLL is actually determining the state of OUTCLK will exist until all of the PLLs once again achieve lock. This system of the present invention allows for errors in up to N−1 (N being the number of PLL circuits in the system) PLLs at a time while still maintaining the correct output. In order to prevent spurious behavior on the output during the times when PLLs are going into lock, the assertion of the LOCK signal from the single PLL must be synchronized to the negative going edge of output clock from that particular PLL instance. Additionally, the de-assertion of the LOCK signal needs to be able to occur asynchronously so as to remove the PLL that is unlocked from the voting as soon as possible. One final consideration to guarantee proper behavior of this system is to minimize the difference in the delays of the feedback paths of the individual PLLs. Mismatch between the delays in these paths will show up in the final output as jitter if the PLLs do drift into and out of lock.

The implementation and method of the present invention greatly reduces the probability that an input clock will fail to have a corresponding output clock from the system of PLLs since it is capable of transitioning between any number of PLLs being in or out of lock to any other number of PLLs being in or out of lock, provided that at least any one of the PLLs is locked at any given time.

Figure 5:
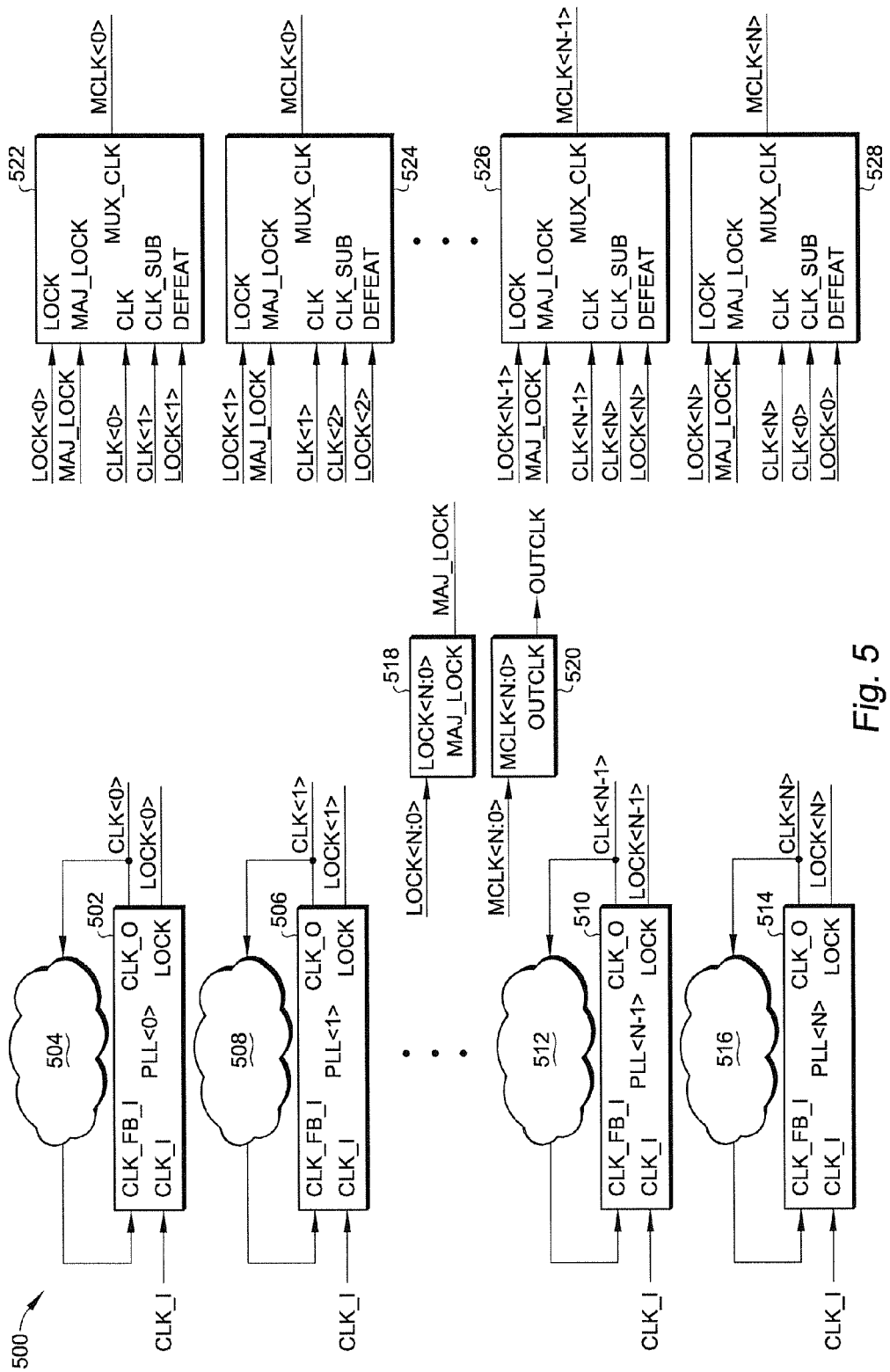
FIG. 5 is a circuit diagram of another PLL multiplexer implementation according to the present invention.

FIG. 5 shows an "N" PLL multiplexer implementation according to the present invention. Note that there is only one majority voter circuit 518 that creates the MAJ_LOCK signal which gets sent to all the multiplexer circuits, as described in the FIG. 6 discussion below. Each multiplexer instance 522, 524, 526, 528 receives the LOCK and CLK signals from the corresponding instance of PLL 502/504, 506/508, 510/512, 514/516 while the CLK_SUB and DEFEAT signals are the CLK and LOCK signals (respectively) from the instance above the corresponding instance of PLL. The CLK_SUB and DEFEAT signals for the $N^{th}$ multiplexer instance use the CLK and LOCK signals (respectively) from the $0^{th}$ PLL instance. Majority voter 520 converts the parallel MCLK inputs into a single OUTCLK signal.

Figure 6:
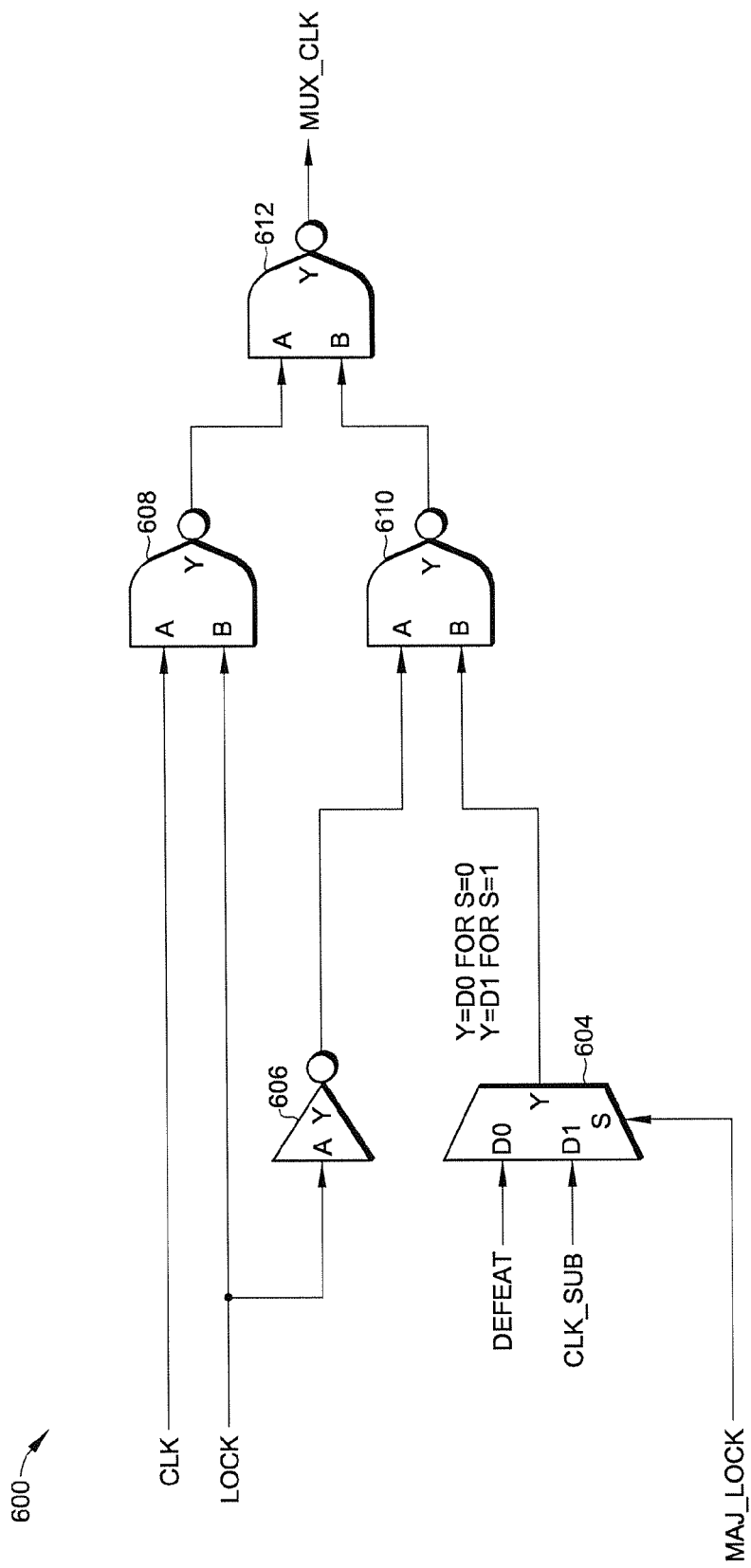
FIG. 6 is a circuit diagram of a PLL clock multiplexer logic circuit associated with FIG. 5.

FIG. 6 shows an "N" PLL clock multiplexer logic circuit 600 according to the present invention. The "N" PLL multiplexer is nearly identical to the one shown in FIG. 2. A key difference is that not all of the LOCK signals are brought into the multiplexer. This is done to conserve area since every PLL will also have this multiplexer circuit and each multiplexer circuit would generate the same MAJ_LOCK signal. Instead, the MAJ_LOCK signal can be created once at a level above this multiplexer and used as an input instead. Thus, elements 604, 606, 608, 610, and 612 correspond to elements 204, 206, 208, 210, and 212 as in FIG. 2. Element 202 is omitted and does not have a corresponding circuit element in circuit 600 of FIG. 6.

FIG. 7 is an "N" PLL clock multiplexer logic truth table 700 according to the present invention. When the LOCK signal is high, the MUX_CLK output is equal to the CLK input. When the LOCK signal is low and MAJ_LOCK is low the MUX_CLK output is equal to the DEFEAT input. When the LOCK signal is low and MAJ_LOCK is high the MUX_CLK output is equal to the CLK_SUB input.

Figure 8:
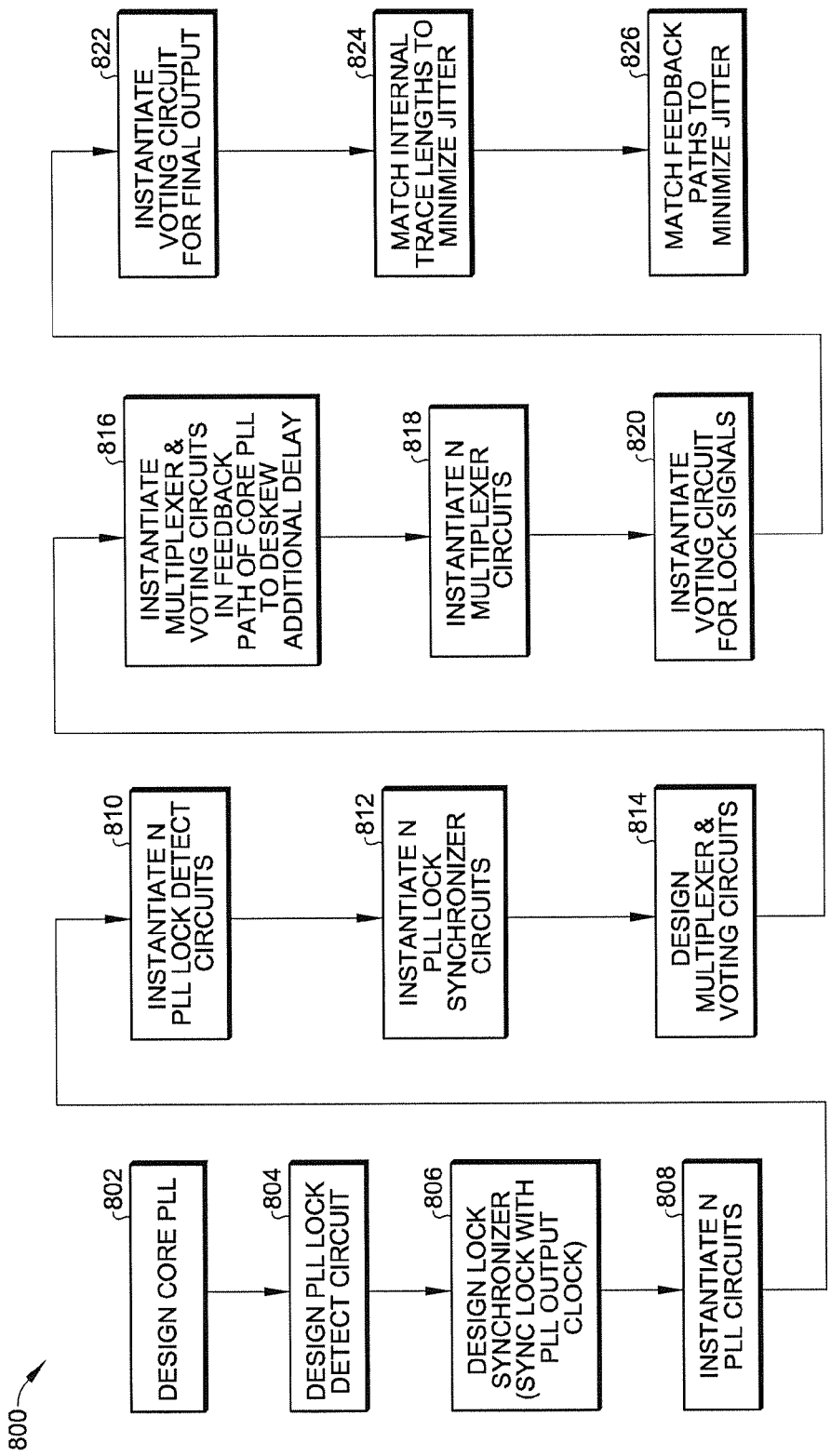
FIG. 8 is a flow chart of the method of the present invention.

FIG. 8 is a flow chart 800 of the method of the present invention using "N" individual PLL circuits. The first step 802 is to design the core PLL to meet the required performance criteria. Then a lock detection circuit must be designed at step 804 to determine when the PLL has achieved a locked state. The output of the lock detection circuit should be synchronized with an edge of the PLL output clock at step 806 so that there are no glitches on the output clock when the PLL enters lock. The PLL, lock detection, and lock synchronizer circuits are each instantiated "N" times at steps 808, 810, and 812. The circuit for multiplexing between the CLK, CLK_SUB, and DEFEAT inputs is then designed at step 814. Additionally, the voting circuit for creating the MAJ_LOCK and OUTCLK signals is designed at step 814. The multiplexer and voting circuits are instantiated inside the core PLL in the feedback path (or someplace in the feedback logic cloud) at step 816 in order to back out the delay caused by adding these circuits to the final output path. The multiplexer circuit is instantiated "N" times at step 818. The voting circuit is instantiated once for voting the LOCK signals to make the MAJ_LOCK signal at step 820. The voting circuit is instantiated once more at step 822 to vote the clock multiplexer outputs into the final OUTCLK signal. The layout of the signals between the "N" instantiations are matched at step 824 to minimize jitter when the state of the LOCK signals change. Finally, the feedback paths are matched to minimize jitter due to the changes in the number of PLLs in lock at step 826.

The above examples describe a PLL circuit with a reliable output clock signal suitable for use in a harsh operating environment. While two general embodiments and methods of operation have been shown and described, it would be understood by those skilled in the art that certain variations of these embodiments and methods could be made such as the precise order of the LOCK signals, the nature of the return paths in the PLL, the number of PLLs, the implementation of the logic that performs the multiplexing between PLLs, and the polarity of the signals. It should therefore be understood that the illustrated examples are examples only and should not be taken as limiting the scope of the present invention. The claims should not be read as limited to the described order or elements unless stated to that effect. Therefore, all examples that come within the scope and spirit of the following claims and equivalents thereto are claimed as the invention.

We claim:

1. A phase-locked loop (PLL) circuit system comprising:
    first, second, and third PLL circuits;
    first, second, and third multiplexer circuits coupled to the first, second, and third PLL circuits, and
    a majority voter circuit coupled to the first, second, and third PLL circuits,
    wherein the PLL circuit system provides a glitch-free output clock signal by selecting a locked PLL circuit, and
    wherein each multiplexer circuit comprises three lock inputs, a first clock input, a second clock input, a defeat input, and a clock output.

2. The PLL circuit system of claim 1 wherein each PLL circuit comprises:
    a first input for receiving a reference clock signal;
    a second input for receiving a feedback clock signal;
    a first output for providing an output clock signal;
    a second output for providing a lock signal; and
    a return path coupled between the first output and the second input.

3. The PLL circuit system of claim 2 wherein the return path comprises a direct connection.

4. The PLL circuit system of claim 2 wherein the return path comprises a logic circuit.

5. The PLL circuit system of claim 1 wherein each multiplexer circuit comprises a majority voter circuit coupled to the three lock inputs.

6. The PLL circuit system of claim 1 wherein each multiplexer circuit comprises a multiplexer coupled to the second clock input and the defeat input.

7. The PLL circuit system of claim 1 wherein each multiplexer circuit comprises a logic circuit coupled to the first clock input.

8. The PLL circuit system of claim 1 wherein each multiplexer circuit comprises a logic circuit coupled to the clock output.

9. The PLL circuit system of claim 1 wherein the majority voter circuit provides the glitch-free output clock signal.

10. A PLL circuit system comprising:
    N PLL circuits;
    N multiplexer circuits coupled to the N PLL circuits, and
    a majority voter circuit coupled to the N PLL circuits,
    wherein N is an integer greater than two,
    wherein the PLL circuit system provides a glitch-free output clock signal by selecting a locked PLL circuit, and
    wherein each multiplexer circuit comprises N lock inputs, a first clock input, a second clock input, a defeat input, and a clock output.

11. The PLL circuit system of claim 10 wherein each PLL circuit comprises:
    a first input for receiving a reference clock signal;
    a second input for receiving a feedback clock signal;
    a first output for providing an output clock signal;
    a second output for providing a lock signal; and
    a return path coupled between the first output and the second input.

12. The PLL circuit system of claim 11 wherein the return path comprises a direct connection.

13. The PLL circuit system of claim 11 wherein the return path comprises a logic circuit.

14. A method of providing a glitch-free output clock signal in a PLL circuit system, the method comprising:
    providing N PLL circuits;
    coupling N multiplexer circuits to the N PLL circuits; and
    selecting a locked PLL circuit with a majority voter circuit so that a glitch-free output clock signal is provided,
    wherein N is an integer greater than two, and
    wherein each multiplexer circuit comprises N lock inputs, a first clock input, a second clock input, a defeat input, and a clock output.

15. The method of claim 14, wherein each PLL circuit comprises:
    a first input for receiving a reference clock signal;
    a second input for receiving a feedback clock signal;
    a first output for providing an output clock signal;
    a second output for providing a lock signal; and
    a return path coupled between the first output and the second input.

16. The method of claim 15, wherein the return path comprises a direct connection.

17. The method of claim 15, wherein the return path comprises a logic circuit.

* * * * *